United States Patent
Ogimoto

(10) Patent No.: US 8,929,131 B2
(45) Date of Patent: Jan. 6, 2015

(54) MAGNETIC MEMORY ELEMENT AND NON-VOLATILE STORAGE DEVICE

(75) Inventor: Yasushi Ogimoto, Higashiyamato (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 794 days.

(21) Appl. No.: 13/131,103

(22) PCT Filed: Aug. 25, 2009

(86) PCT No.: PCT/JP2009/064771
§ 371 (c)(1),
(2), (4) Date: Nov. 3, 2011

(87) PCT Pub. No.: WO2010/064476
PCT Pub. Date: Jun. 10, 2010

(65) Prior Publication Data
US 2012/0268986 A1    Oct. 25, 2012

(30) Foreign Application Priority Data
Dec. 2, 2008   (JP) ................. 2008-307267

(51) Int. Cl.
*G11C 11/00*    (2006.01)
*H01L 27/22*    (2006.01)
*H01L 43/08*    (2006.01)
*G11C 11/16*    (2006.01)

(52) U.S. Cl.
CPC .............. *H01L 27/224* (2013.01); *H01L 43/08* (2013.01); *G11C 11/161* (2013.01); *G11C 11/1675* (2013.01); *G11C 11/16* (2013.01)
USPC .......................................... 365/158; 365/173

(58) Field of Classification Search
USPC .......................................... 365/158, 171, 173
See application file for complete search history.

(56) References Cited

U.S. PATENT DOCUMENTS

| 6,667,897 | B1 * | 12/2003 | Abraham et al. ............. 365/145 |
| 6,980,470 | B2 * | 12/2005 | Ohmori ......................... 365/171 |
| 2005/0047206 | A1 | 3/2005 | Nozieres et al. |

FOREIGN PATENT DOCUMENTS

| EP | 1244117 A2 | 9/2002 |
| JP | 2002208681 A | 7/2002 |

(Continued)

OTHER PUBLICATIONS

D. D. Djayaprawira et al., "230% room-temperature magnetoresistance in CoFeB/MgO/CoFeB magnetic tunnel junctions," 092502, Applied Physics Letters, vol. 86, 2005.

(Continued)

*Primary Examiner* — Kretelia Graham
(74) *Attorney, Agent, or Firm* — Rabin & Berdo, P.C.

(57) ABSTRACT

The present invention provides a magnetic memory element that has a spin valve structure formed using a free layer, a non-magnetic layer, and a pinned layer. The free layer has a three-layer structure having a first magnetic layer, an intermediate layer, and a second magnetic layer arranged in this order viewed from the non-magnetic layer. The first magnetic layer is made of a ferromagnetic material. The intermediate layer is made of a non-magnetic material. The second magnetic layer is made of an N-type ferromagnetic material having a magnetic compensation point in the temperature range where a memory storage operation can be available. The magnetization direction of the first magnetic layer and the magnetization direction of the second magnetic layer are parallel to each other at the temperature lower than the magnetic compensation point $T_{comp}$.

20 Claims, 7 Drawing Sheets

(56) References Cited

FOREIGN PATENT DOCUMENTS

| | | |
|---|---|---|
| JP | 2004-172614 A | 6/2004 |
| JP | 2004-179483 A | 6/2004 |
| JP | 2006-128579 A | 5/2006 |
| JP | 2007-088068 A | 4/2007 |
| JP | 2007-150265 A | 6/2007 |
| JP | 2008277621 A | 11/2008 |

OTHER PUBLICATIONS

J. Hayakawa et al., "Current-induced magnetization switching in MgO barrier based magnetic tunnel junctions with CoFeB/Ru/CoFeB synthetic ferromagnetic free layer," Japanese Journal of Applied Physics, Vol.45, L1057-L1060, 2006.

D. H. Lee et al., "Increase of temperature due to Joule heating during current-induced magnetization switching of an MgO-based magnetic tunnel junction," Applied Physics Letters, vol. 92, 233502, 2008.

* cited by examiner

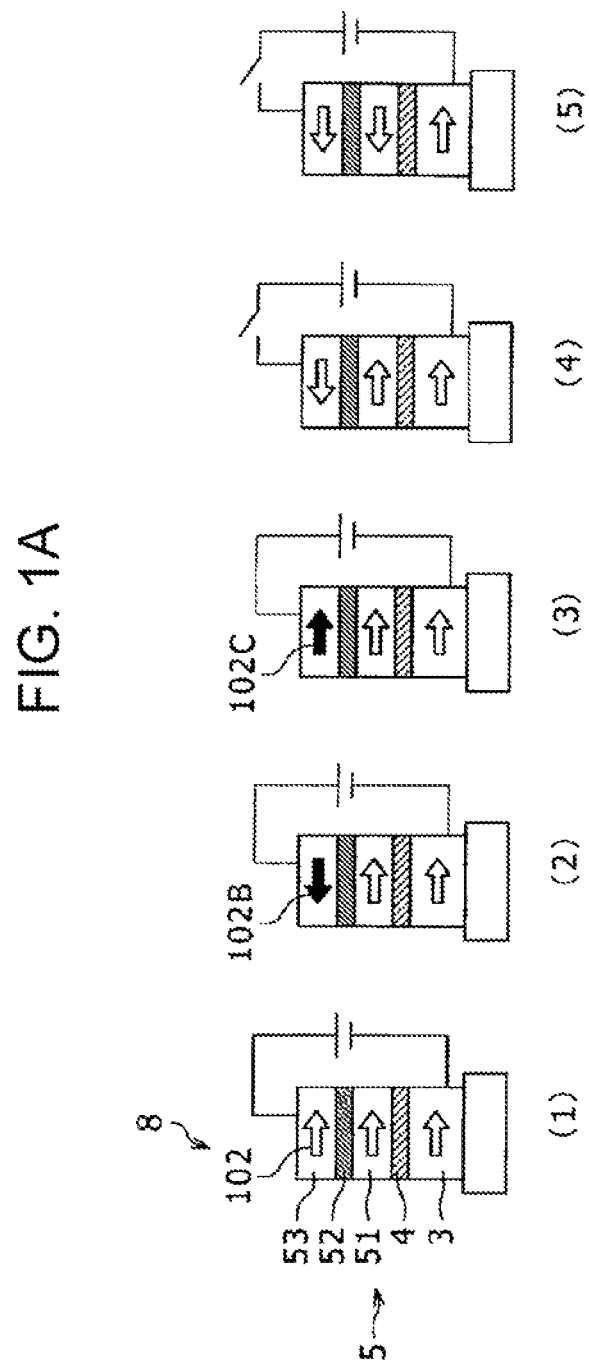

MAGNETIC MEMORY ELEMENT AND NON-VOLATILE STORAGE DEVICE

This application is a national stage application under 35 U.S.C. §371 of International Application No. PCT/JPg2009/64771, filed Aug. 25, 2009, and claims the benefit under 35 U.S.C. §119 of the earlier filing date of Japanese Patent Application 2008-307267, filed Dec. 2, 2008.

TECHNICAL FIELD

The present invention relates to a magnetic memory element that can store information using an electrical means and a non-volatile storage device using the same.

BACKGROUND ART

In recent years, the capacity of a non-volatile semiconductor storage device that is represented by a flash memory has remarkably increased, and it is announced that a product having the capacity of about 32 GB is released. The non-volatile semiconductor storage device is increasing in a commodity value, particularly as a USB memory or a storage device for a mobile phone. In addition, principled superiority of the non-volatile semiconductor storage device such as vibration resistance, high reliability, and low power consumption implemented by only a solid-state element memory attracts attention, and thus the non-volatile semiconductor storage device becomes a mainstream storage device for a portable electronic apparatus, such as a storage device for a portable music player to reproduce music and an image.

Meanwhile, separately from an application for the storage device, realization of the same performance as that of a Dynamic Random Access Memory (DRAM) currently used as a main memory of an information apparatus in the non-volatile semiconductor storage device is actively studied. This study is performed to realize a computer that starts at once in a used state and decreases the power consumption to nearly zero in a waiting state, that is, a so-called "instant-on computer." For this reason, a memory element of the non-volatile semiconductor storage device needs to satisfy the following conditions: (1) the switching speed being less than 50 ns and (2) a rewrite count being more than $10^{16}$, which are technology specifications required for the DRAM. The lower limit ($10^{16}$) of the rewrite count that is exemplified in the technology specifications is a numerical value that is defined on the basis of an access count of when access is repeatedly executed every 30 ns during ten years. When the non-volatile semiconductor storage device is used as the main memory, a refresh cycle is not needed. Therefore, the non-volatile semiconductor storage device can be used for the same purpose as the current DRAM, even when the rewrite count is a rewrite count less than the above rewrite count.

As candidates of this next-generation non-volatile semiconductor storage device, non-volatile memory elements based on various principles, such as a ferroelectric random-access memory (FeRAM), a magnetic random-access memory (MRAM), and a phase-change random-access memory (PRAM), are studied and developed. However, as candidates of a memory element that replaces the DRAM and satisfies the above technology specification, the MRAM that uses a magnetoresistance element as a memory element has great promise. Hereinafter, the memory element using the magnetoresistance element is called a "magnetic memory element." Although the MRAM is on trial, the MRAM already achieves rewrite count performance of $10^{12}$ or more and the switching speed thereof is also the high speed less than 10 ns. Therefore, as compared with the other non-volatile semiconductor storage devices, realizable possibility of the MRAM is high.

A first problem of the MRAM is that an area occupied by one memory cell (cell area) is large, increasing a bit cost. Specifically, the currently commercialized MRAM that has the small capacity of about 4 Mbits is of a current magnetic field rewrite type. If a minimum processing dimension of a manufacturing process is set to F, the cell area becomes 20 to 30 $F^2$ or more. As a result, it is difficult to miniaturize the cell. In the MRAM of the current magnetic field rewrite type, when the cell area is configured to be small, a reverse magnetic field (that is, minimum value as an external magnetic field to reverse magnetization) may be increased, and a current value needed for reverse may be increased as the cells are miniaturized by increasing an integration degree. For this reason, it is unrealistic to replace the DRAM by the MRAM of the current magnetic field rewrite type.

In order to change this situation, two technologies that become a breakthrough are suggested. One is a method using a Magnetic Tunnel Junction (MTJ) using an MgO tunnel insulating film. If this method is used, a magnetoresistance ratio of 200% or more can be easily obtained (refer to D. D. Djayaprawira et al., "230% room-temperature magnetoresistance in CoFeB/MgO/CoFeB magnetic tunnel junctions," 092502, Applied Physics Letters, Vol. 86, 2005). The other is a current-injection magnetization reversal method. In particular, in the current-injection magnetization reversal method, principled difficulty with respect to miniaturization such as the increase in the reversal magnetic field according to the miniaturization of the cells, is not generated. If the cells are miniaturized, the current necessary for the magnetization reversal can be decreased according to a scaling rule, and write energy can be decreased according to the miniaturization. Since the configuration of the memory cell using one transistor per magnetic tunnel junction (MTJ) is enabled by the current-injection magnetization reversal method, it is predicted that the cell area can become 6 to 8 $F^2$ ideally, that is, a cell area equal to the cell area of the DRAM (refer to J. Hayakawa et al., "Current-induced magnetization switching in MgO barrier based magnetic tunnel junctions with CoFeB/Ru/CoFeB synthetic ferromagnetic free layer," Japanese Journal of Applied Physics, Vol. 45, L1057-L1060, 2006). Hereinafter, the configuration of the memory cell using one transistor per magnetic tunnel junction (MTJ) is called "1 transistor-1 MTJ configuration." The configuration of the memory cell ("1 diode-1 MTJ configuration") that aims at achieving a small cell area (4 $F^2$ or less) equal to a cell area of a flash memory and uses one diode per MTJ is also suggested (refer to Japanese Patent Application Laid-Open (JP-A) No. 2004-179483). In an element where a driving layer whose magnetization direction is almost fixed to a stack direction is provided, by using only one current polarity, two kinds of transistors are decreased to one kind of transistor to simplify a circuit. By realizing a circuit of 1 transistor-1 MTJ, the cell size is decreased to become the same cell size as that of the DRAM (refer to Japanese Patent Application Laid-Open (JP-A) No. 2006-128579.

However, according to the 1 diode-1 MTJ configuration that is disclosed in Japanese Patent Application Laid-Open (JP-A) No. 2004-179483, switching is performed by currents of both directions of a forward bias and a backward bias through the diode. That is, the switching is performed by a current (forward current) in the forward bias and a leak current in the reverse bias. For this reason, there is no change in the principle of the switching being performed by the polarity of the current. In this case, the diode is originally formed to execute selection of the MTJ in write, erase, and read operations without disturbance (crosstalk), and the leak current flows in the forward direction as well as the reverse direction. According to the above configuration that uses the operation principle of the switching being generated by the leak current in the reverse bias, the current sufficient for the switching may flow at the time of the low voltage of the forward bias. For this reason, in the operation principle, an effect of preventing disturbance becomes insufficient. That is, when the switching can be performed by the leak current of the reverse bias, the current flows at the time of the low voltage in the forward bias, and the same problem of disturbance as a simple matrix type memory that has no element selection switch cannot be avoided. For this reason, a high-integration element cannot be realized. As such, in order to realize a cross point type memory based on the 1 diode-1 MTJ configuration having a minimum cell area of 4 $F^2$, the current-injection magnetization reversal method that uses the operation principle of the switching based on the polarity of the current cannot be adopted.

According to the configuration disclosed in Japanese Patent Application Laid-Open (JP-A) No. 2006-128579, that is, the 1 transistor-1 MTJ configuration using the element where the driving layer whose magnetization direction is almost fixed to the stack direction is provided, the switching is performed by inducing spin precession (precession motion) by spin injection from the driving layer to the free layer. However, in the operation principle of the spin precession being induced by the spin injection from the driving layer, the magnetization arrangement (combination of the magnetization directions) where magnetization directions of the free layer (storage layer) and the pinned layer (magnetization fixing layer) are parallel or anti-parallel may be deviated to one of parallel arrangement and anti-parallel arrangement. According to this configuration, the magnetization direction of the pinned layer (magnetization fixed layer) may be changed, and reliability may be lowered, when a rewrite count equal to that of the DRAM is realized. For this reason, it is difficult to realize the 1 transistor-1 MTJ configuration where the switching is performed using only the polarity of the current.

SUMMARY OF THE INVENTION

The present invention has been made in view of the above problems, and it is an object of the present invention to provide a magnetic memory element and a storage device using the same that can realize a memory cell having the 1 diode-1 MTJ configuration where a switching operation is performed by an electric pulse having the single polarity, to decrease a size, increase a capacity, and increase the upper limit of a rewrite count in a non-volatile semiconductor storage device.

The inventor closely examined the above problems in consideration of the basic characteristics of the magnetization of the magnetic materials that are used in the MRAM, and reexamine operation elements as the memory element.

That is, the inventor paid attention to that a switching operation to write needed information can be executed, when the magnetization of the free layer can be reversed by any means without reversing the polarity of the current pulse. This is paradoxical at a glance, but is a point of this invention. The point to be considered is to determine whether the magnetization of the free layer is reversed in only a needed operation (only one of a set operation and a reset operation) of a write operation (set operation and reset operation) and a read operation (reproduction operation) of information with respect to a spin valve element and can return to the original magnetization arrangement after the operation ends, and the magnetization of the free layer is not reversed in the other of the set operation and the reset operation and the reproduction operation. Aspects of the present invention that enable an operation principle thought to be impossible at a glance are as follows.

According to one aspect of the present invention, the relationship between the magnetic compensation point (temperature at which the magnetization in the appearance is reversed) of the N-type ferrimagnetic material and the operation temperature of the second magnetic layer having the N-type ferrimagnetic material is appropriately set using the free layer of the three-layer structure of the first magnetic layer made of the ferromagnetic material, the intermediate layer made of the non-magnetic material, and the second magnetic layer made of the N-type ferrimagnetic material, from the side of the non-magnetic layer of the spin valve structure, and the thickness of the intermediate layer is appropriately set such that the magnetization direction of the first magnetic layer and the magnetization direction of the second magnetic layer become parallel to each other at the ordinary temperature. That is, the temperature of the second magnetic layer made of the N-type ferrimagnetic material may exceed the magnetic compensation point in any one of the case where the write pulse at the time of the set operation (operation of making a state of the magnetic memory element become a low resistance state) is applied and the case where the write pulse at the time of the reset operation (operation of making a state of the magnetic memory element become a high resistance state) is applied, and may be lower than the magnetic compensation point in the other case. In this disclosure, for the purpose of making the description clear, the "set operation" is described as the operation of making the state of the magnetic memory element become the low resistance state, that is, the operation of obtaining the parallel magnetization arrangement from the arbitrary magnetization arrangement, and the "reset operation" is described as the operation of making the state of the magnetic memory element become the high resistance state, that is, the operation of obtaining the anti-parallel magnetization arrangement from the arbitrary magnetization arrangement. However, the magnetization arrangements that are set to the set operation and the reset operation are arbitrarily determined. In the above description and the following description, even though the terms of the set and the reset are changed, it should be noted that the operation description of this application is the same.

That is, a magnetic memory element according to an aspect of the present invention that is provided to resolve the above problems is a magnetic memory element that has a spin valve structure including a free layer, a non-magnetic layer, and a pinned layer sandwiching the non-magnetic layer with the free layer. In the magnetic memory element, write pluses to control a combination of the magnetization of the free layer and the magnetization of the pinned layer are applied between the free layer and the pinned layer of the spin valve structure, and information according to the write pulses is recorded. The free layer has a three-layer structure in which a first magnetic layer, an intermediate layer, and a second magnetic layer are stacked from the side of the non-magnetic layer, the first magnetic layer is made of a ferromagnetic material, the intermediate layer is made of a non-magnetic material, the second magnetic layer includes an N-type ferrimagnetic material that has a magnetic compensation point $T_{comp}$ in a memory storage operation temperature range of the magnetic memory element, and magnetization directions of the first magnetic layer and the second magnetic layer are parallel to each other at the temperature lower than the magnetic compensation point $T_{comp}$.

The spin valve structure is a structure that includes a magnetic layer (pinned layer)/a non-magnetic layer/a magnetic layer (free layer). In the magnetization of the pinned layer, it is difficult to cause the reverse with respect to the action for causing the reverse such as the current-injection magnetization reversal, as compared with the magnetization of the free layer. In order to make the reversal of the magnetization of the pinned layer difficult, a method that provides a layer of the antiferromagnetic material to come close to the pinned layer and increases the effective coercive force of the pinned layer by the exchange coupling interaction of the magnetizations between the pinned layer and the antiferromagnetic layer may be used. As another aspect, the thickness of the pinned layer may be sufficiently increased to make the change of the magnetization difficult, and the magnetic property of the pinned layer may be set to be different from the magnetic property of the free layer. In both cases, a principle that is used when information is read uses a phenomenon of a resistance value being changed to correspond to the relative change in an angle of the magnetization of the free layer with respect to the magnetization of the pinned layer. That is, when the information is read, a phenomenon of resistance being lowest in the case of arrangement (parallel arrangement) where the magnetization direction of the free layer and the magnetization direction of the pinned layer become parallel to each other and the resistance being highest in the case of arrangement (anti-parallel arrangement) where the magnetization direction of the free layer and the magnetization direction of the pinned layer become anti-parallel to each other may be used. When the free layer has the three-layer structure of the first magnetic layer, the intermediate layer, and the second magnetic layer as viewed from the side of the non-magnetic layer, the information can be read by electrically detecting whether the magnetization direction of the first magnetic layer and the magnetization direction of the pinned layer in the free layer are parallel or anti-parallel to each other.

In this case, the non-magnetic layer performs a function of cutting the magnetic coupling between the magnetic layers (between the pinned layer and the free layer). In the case where the insulator is used, when a metal is used as a giant magnetoresistance (GMR) element, the magnetic memory element is operated as a tunneling magnetoresistance (TMR) element. However, when switching is performed by a current, the pinned layer does not need to have the large coercive force (Hc) or magnetic anisotropy (Ku), and it becomes important to sufficiently increase the magnetization (Ms) and make generation of the precession motion of the spin difficult. The N-type ferrimagnetic material is a material in which two kinds of anti-parallel magnetizations A and B exist (for example, in the case of TbFeCo, two kinds of magnetizations of the magnetization of Tb and the magnetization of FeCo), and temperature dependencies are different from each other and the temperature (magnetic compensation point $T_{comp}$) at which the magnetization (A-B) in the appearance is lost exists. At the high-temperature side and the low-temperature side with the magnetic compensation point $T_{comp}$ as a boundary, the magnetizations (net magnetizations) of the N-type ferrimagnetic material in the appearance become opposite to each other.

The temperature range where a memory storage operation can be available in this disclosure is a range of the temperature lower than the temperature at which the temperature of the N-type ferrimagnetic material becomes the magnetic compensation temperature by applying the pulse and performing the write operation in the temperature range taken by the second magnetic layer made of the N-type ferrimagnetic material in the free layer having the three-layer structure, and a range of the temperature of the magnetic change layer at the time of being used to hold the information stored by the spin valve element. For this reason, even though the temperature rise is generated by, e.g., in, the magnetic change layer by the current flowing for read, the temperature at that time is lower than the temperature of when the write operation is performed, and the temperature is in the temperature range where a memory storage operation can be available, as long as the storage is retained. A specific example of the temperature range is −20° C. to 150° C. This is because the operation temperature of the storage device is −20° C. to 120° C. when a temperature range (−20° C. to 80° C.) where the temperature range of an environment using the storage device using the spin valve element according to the present invention is generally assumed as the internal temperature of the electronic apparatus is set to a guaranteed operation temperature range, and the temperature range of the localized spin valve element that performs the memory storage operation is −20° C. to 150° C. The specific example of the temperature is only exemplary and the temperature range where a memory storage operation can be available is variously set according to a specific application.

The relationship of the magnetization of the second magnetic layer made of the N-type ferrimagnetic material and the magnetization of the first magnetic layer (layer of the ferromagnetic material) formed through the intermediate layer (for example, Ru or Cu) can be controlled to be ferromagnetically coupled with the magnetization of the second magnetic layer (that is, the arrangement is the parallel arrangement), by appropriately selecting the thickness of the intermediate layer on the basis of the RKKY interaction, for example, selecting the thickness of 2 nm or less. Even when any write pulse is applied, by the exchange coupling force to make the magnetization directions of the first magnetic layer and the second magnetic layer parallel to each other and the spin injection from the pinned layer to the second magnetic layer through the first magnetic layer, the magnetization direction of the second magnetic layer that is made of the ferrimagnetic material is controlled to be parallel to the magnetization direction of the first magnetic layer. At the time of the read operation after the write operation, since only the current not more than the threshold value of the current-injection magnetization reversal flows, the exchange coupling force of the first magnetic layer and the second magnetic layer becomes dominative, and the magnetization direction of the first magnetic layer is maintained to be parallel to the magnetization direction of the second magnetic layer. In this way, the combination of the magnetization of the first magnetic layer and the second magnetization layer in the free layer having the three-layer structure and the magnetization of the pinned layer can be controlled, and switching based on the current-injection magnetization reversal using the electric pulse having the single polarity is enabled. In this case, the write pulses may be two pulses to write two magnetization combination states according to two different pieces of information, when information is recorded as a combination state of the magnetization of the first magnetic layer and the second magnetic layer in the free layer and the magnetization of the pinned layer. In the magnetic memory element according to this disclosure, according to the write pulse, the current-injection magnetization reversal is generated to erase the immediately previous state, if necessary, and the desired magnetic combination state may be realized and may be used in recording of the information.

According to the configuration having the above characteristic, since the magnetoresistance ratio is determined according to a spin polarization ratio of a portion in the vicinity of the non-magnetic layer interface (about 1 nm or less) in the free layer or the magnetic layer of the pinned layer, the magnetoresistance ratio is configured to depend on the ferromagnetic material used in the first magnetic layer, and the magnetic characteristic (magnetic compensation point) of the second magnetic layer made of the N-type ferrimagnetic material can be designed independently from the spin polarization ratio.

In the magnetic memory element according to the present invention, the non-magnetic layer preferably includes Ru or Cu. In the non-magnetic layer, a metal that does not show magnetism is generally used. In particular, Ru or Cu is preferably used in the non-magnetic layer, because the magnetization direction of the second magnetization layer becomes parallel to the magnetization direction of the first magnetic layer at the temperature lower than the magnetic compensation point $T_{comp}$.

The thickness of the intermediate layer of the magnetic memory element according to the present invention is preferably 2 nm or less.

According to the configuration having the above characteristic, the coupling of the first magnetic layer and the second magnetic layer can be ferromagnetically controlled according to the thickness of the intermediate layer by the RKKY interaction. Since the thickness of 2 nm or less is less than the spin relaxation length, the current-injection magnetization reversal is enabled by the spin injection from the pinned layer to the second magnetic layer through the first magnetic layer. The magnetic characteristic can be prevented from being deteriorated due to mixing at the interface when the first magnetic layer and the second magnetic layer are formed.

In the magnetic memory element according to the present invention, preferably, an easy magnetization axis of the first magnetic layer is any direction in a plane of the first magnetic layer and an easy magnetization axis of the second magnetic layer is a direction that has a component vertical to the plane of the first magnetic layer.

According to the configuration having the above characteristic, since the anisotropic magnetic field of the direction perpendicular to the plane can be used, the in-plane anisotropy is not applied to the element shape. Thereby, since the shape in the cell plane does not need to be rectangular, the cell size can be decreased.

In the magnetic memory element according to the present invention, preferably, the non-magnetic layer is made of magnesium oxide (MgO), the first magnetic layer is made of a CoFeB alloy or a CoFe ally, and the second magnetic layer is made of a binary or ternary rare earth transition metal alloy including a combination of a rare earth metal of Tb or Gd and a transition metal of Fe or Co.

According to the configuration having the above characteristic, the structure that shows the high magnetoresistance ratio can be obtained. For example, the above structure is an MgO or CoFeB structure that shows the magnetoresistance ratio of 100% or more. The TbFeCo alloy is an alloy that includes terbium (Tb), iron (Fe), and cobalt (Co) with an arbitrary ratio other than 0. By changing the relative component ratio of each element, the magnetic compensation point can be adjusted by the continuous composition change in the temperature range of about 250° C. from the room temperature. Therefore, the operation condition, that is, the height and the pulse width of the electric pulse used in the write operation can be easily adjusted.

In the magnetic memory element according to the present invention, preferably, the magnetic compensation point $T_{comp}$ of the N-type ferrimagnetic material is lower than the temperature of the second magnetic layer that arrives when one write pulse is applied, and is higher than the temperature of the second magnetic layer that arrives when another write pulse is applied. That is, preferably, the write pulse that makes the temperature of the second magnetic layer made of the N-type ferrimagnetic material not higher than the magnetic compensation point $T_{comp}$, and the write pulse that makes the temperature of the second magnetic layer higher than the magnetic compensation point $T_{comp}$ are separately used. Thereby, write can be performed in a state where the magnetization direction of the ferrimagnetic layer in the appearance is a desired direction.

The present invention can be implemented as a non-volatile storage device. That is, the non-volatile storage device includes the above-described magnetic memory element, a rectifier element that is connected in series to the magnetic memory element, a first write pulse that causes a combination state of the magnetization of the free layer (specifically, first magnetic layer constituting the free layer) and the magnetization of the pinned layer in the spin valve structure of the magnetic memory element to become a first combination state, an information rewriting unit that generates a second write pulse having the same polarity as the polarity of the first write pulse to cause the combination state to become a second combination state, applies the second write pulse to the rectifier element and the magnetic memory element, and executes a write/erase operation, and a read unit that reads the stored information from the amount of current flowing through the magnetic memory element. The non-volatile storage device includes the magnetic memory element, the rectifier element that is connected in series to the magnetic memory element, an information rewrite unit that executes a write/erase operation based on a driving method, and a read unit that reads the stored information from the amount of current flowing through the magnetic memory element.

According to the non-volatile storage device having the above characteristic, since switching is enabled by the electric pulse having the single polarity, the memory cell having the 1 diode-1 MTJ configuration can be manufactured, and the cell area 4 $F^2$ that is equal to the cell area of the flash memory can be realized. Therefore, since a non-volatile storage device performing a high-speed operation and including high rewrite count performance can be integrated onto a substrate with high density, a non-volatile storage device that has high performance can be provided at a low cost.

As described above, in the magnetic memory element and the non-volatile storage device including the magnetic memory element and the driving method thereof according to the present invention, the spin injection and the exchange interaction cooperatively act, and switching based on the electric pulse having the single polarity is enabled. Therefore, the memory cell that has the 1 diode-1 MTJ configuration and the size of 4 $F^2$ can be manufactured, and the storage device using the memory cell can be manufactured. Thereby, a non-volatile storage device that has high performance and a high degree of integration can be realized at a low cost.

BRIEF DESCRIPTION OF THE DRAWINGS

FIG. 1A is a diagram schematically showing an operation principle of a reset operation of a magnetic memory element.

DETAILED DESCRIPTION OF THE INVENTION

[First Embodiment]

Figure 1B:
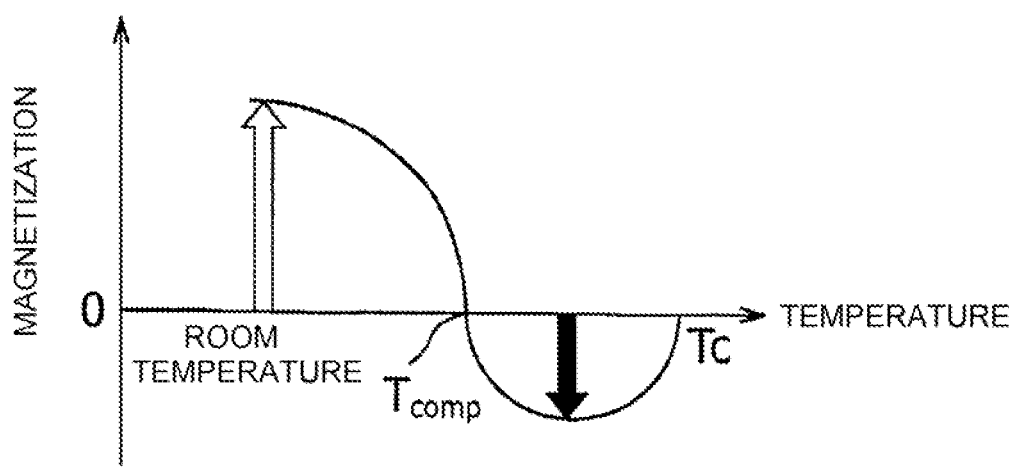
FIG. 1B shows a relationship of a magnetization direction of a second magnetic layer and element temperature according to an embodiment of the present invention.

A magnetic memory element according to a first embodiment of the present invention will be described on the basis of FIGS. 1 to 6.

As described above, the current-injection magnetization reversal method reverses the magnetization of the free layer by the polarity of the current (direction of the current). In order to cause the magnetization directions of both the free layer and the pinned layer to be parallel to each other, the current flows from the free layer side, that is, electrons that are spin-polarized electrons from the pinned layer side through a non-magnetic layer are injected into the free layer. In contrast, in order to cause the magnetization directions of both the free layer and the pinned layer to be anti-parallel to each other, the current flows from the pinned layer side, that is, electrons that are spin-polarized electrons from the free layer side through a non-magnetic layer are injected into the pinned layer. The reason why the magnetization directions of the free layer and the pinned layer become anti-parallel to each other is that only the electrons having the spin parallel to the magnetization direction of the pinned layer can transmit the pinned layer and the non-magnetic layer from the free layer, the electrons having the spin anti-parallel to the magnetization direction of the pinned layer are reflected and are accumulated in the free layer, and as a result, the magnetization direction of the free layer becomes anti-parallel to the magnetization direction of the pinned layer. That is, the current-injection magnetization reversal method injects the electrons (spin) such that an angular motion amount including the localized spin is maintained.

In this case, conditions that are needed to equally use the current polarity of when information is recorded in a spin valve element in a set operation and a reset operation (uses the single polarity), from the principle of the current-injection magnetization reversal method, will be described. As for the current-injection magnetization reversal method, a condition where the magnetization arrangement (direction of the magnetization) of the free layer is constant during the current of the same polarity is assumed tacitly. For this reason, all the current-injection magnetization reversal performs switching by the polarity of the current. In order to realize the minimum cell area 4 $F^2$ of the 1 diode-1 MTJ, a high degree of integration is required in a circuit element to select and drive the magnetic memory element. The inventor paid attention to that a condition where the magnetization arrangement of the free layer is not changed under the current of the same polarity (this is called a restricted magnetization arrangement condition) is not the essential element of the current-injection magnetization reversal method, that is, the technology of the current-injection magnetization reversal according to the related art is actually studied only when the restricted magnetization arrangement condition is assumed tacitly, and came to find the configuration of the present invention.

In this disclosure, even though the set operation, the reset operation, and the correspondence relationship of the magnetization arrangement and the resistance value are maintained in the same way as the above case, the temperature of the free magnetic layer may exceed the magnetic compensation point of the N-type ferrimagnetic material during the set operation and the reset operation. Hereinafter, after the case where the temperature of the ferrimagnetic layer exceeds the magnetic compensation point of the N-type ferrimagnetic material at the time of reset operation is described, the reverse case will be described.

Figure 2:
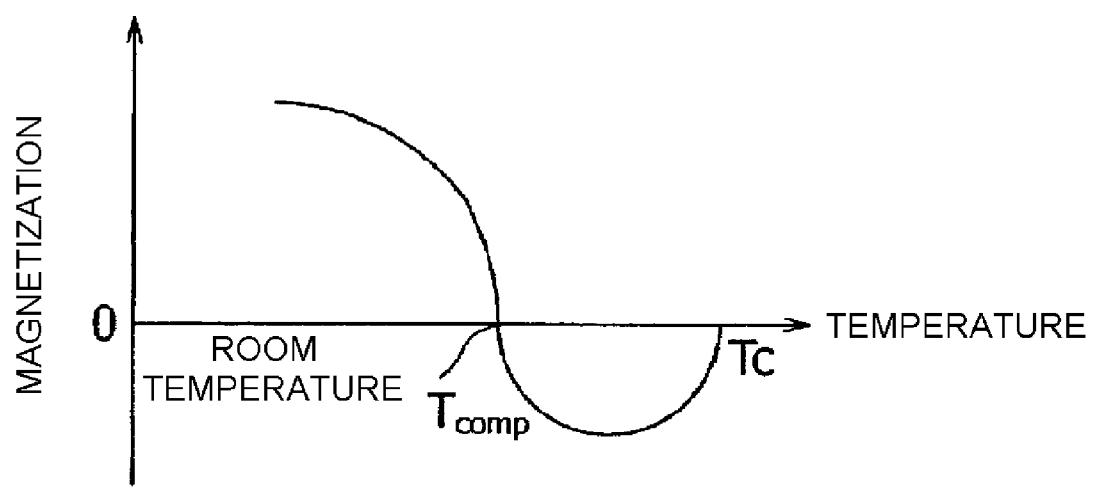
FIG. 2 is a diagram schematically showing a relationship of magnetization and temperature of an N-type ferrimagnetic material that is used as a second magnetic layer constituting a magnetic memory element according to an embodiment of the present invention and shows a magnetic compensation point.
Figure 3A:
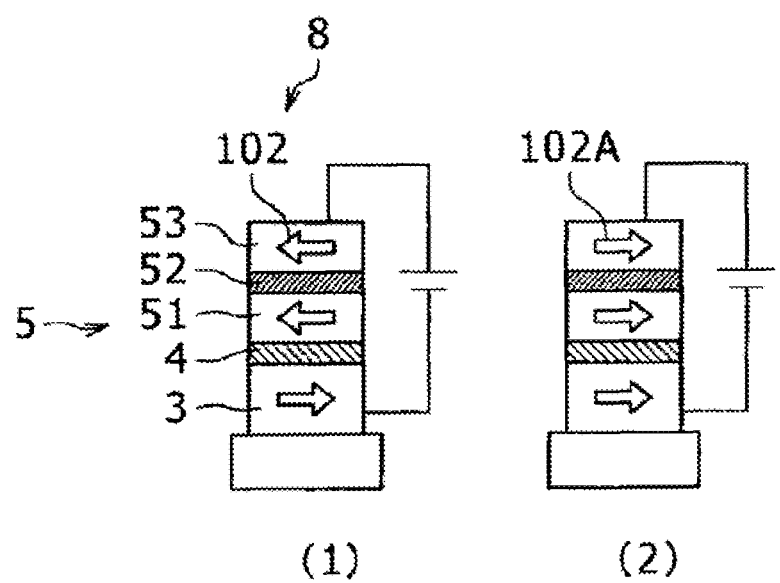
FIG. 3A is a diagram schematically showing an operation principle of a set operation of a magnetic memory element.
Figure 3B:
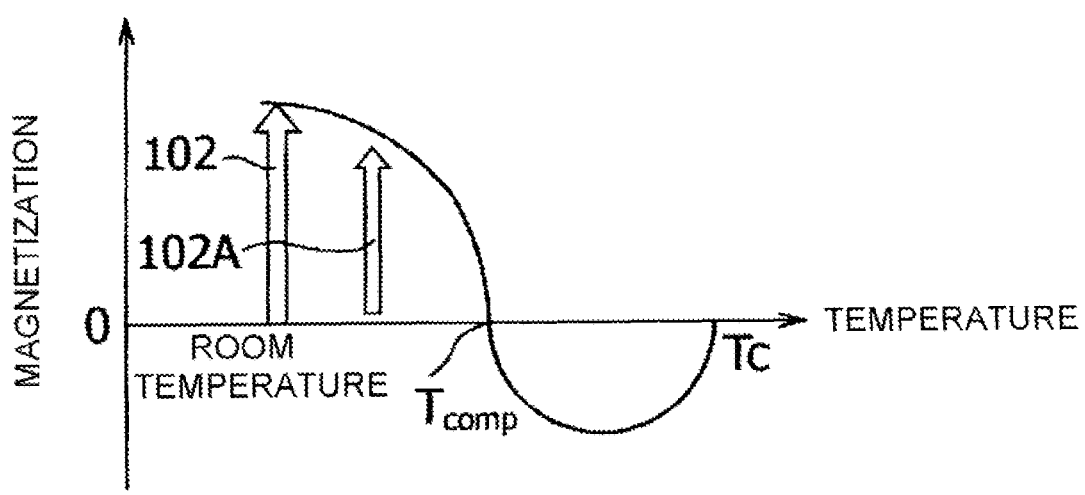
FIG. 3B shows a relationship of a magnetization direction of a second magnetic layer and element temperature according to an embodiment of the present invention.

In order to cause the magnetic direction during the reset operation to be reversed to the magnetization direction during the other operations, the temperature of the ferrimagnetic layer may exceed the magnetic compensation point during the reset operation, and may be lowered than the magnetic compensation point after the reset operation ends. In the element that is used in the current-injection magnetization reversal, since a junction area is smaller than 100 nm×200 nm from a viewpoint of a degree of integration, if an electric pulse is applied at the time of switching, the temperature of the element is increased by the Joule heating. In each embodiment of the present invention, switching based on the electric pulse of the single polarity is enabled by actively using the temperature rise and introducing a new design parameter such as the temperature in the operation principle defined by the polarity of the current. As described above, the N-type ferrimagnetic material is a material in which the magnetic compensation point $T_{comp}$ where magnetization (A-B) in the appearance is lost exists. Therefore, as shown in FIG. 2, when the temperature is higher or lower than the magnetic compensation point, a sign of the magnetization (A-B) in the appearance is reversed. The magnetic compensation point can be adjusted by the composition.

The configuration of a magnetic memory element that has the above structure and an operation principle thereof will be described. The configuration of the magnetic memory element will be first described using FIG. 3A. A magnetic memory element 8 has a stack structure of a free layer 5, a non-magnetic layer 4, and a pinned layer 3. The free layer 5 has a first magnetic layer 51 at the side of the non-magnetic layer 4, and an intermediate layer 52 is sandwiched by the first magnetic layer 51 and a second magnetic layer 52. A current pulse of the single polarity is applied to the magnetic memory element 8 from the outside and the magnetic memory element 8 is operated.

Next, of the operation principle, the set operation, that is, the operation of causing the magnetic arrangements of the pinned layer 3 and the free layer 5 to be parallel to each other will be first described. The magnetic directions of the first magnetic layer 51 and the second magnetic layer 53 that constitute the free layer 5 are parallel to each other. As shown in (1) of FIG. 3A, if a positive current (pulse) is applied from the side of the free layer 5 to the pinned layer 3, in the same way as the related art, torque based on the spin injection from the pinned layer 3 acts with respect to the magnetization of the first magnetic layer 51, and a direction thereof becomes a direction where the magnetization of the first magnetic layer 51 is parallel to the magnetization of the pinned layer 3. The magnetization of the second magnetic layer 53 is affected by an action of torque based on the spin injection with respect to the second magnetic layer 53 through the first magnetic layer 51 and an action of the exchange coupling force between the magnetization of the first magnetic layer 51 and the magnetization of the second magnetic layer 53. In this case, the thickness of the intermediate layer 52 is selected such that the magnetization direction of the first magnetic layer 51 and the magnetization direction of the second magnetic layer 53 become parallel to each other. Therefore, similar to the action of the torque based on the spin injection, the action based on the exchange coupling force acts to cause the magnetization direction of the second magnetic layer 53 to be parallel to the magnetization direction of the first magnetic layer 51. In this way, the magnetization direction of the free layer 5 that has the three-layer structure becomes parallel to the magnetization direction of the pinned layer 3 (refer to (2) of FIG. 3A). At this time, since the current flows and the Joule heat is generated, the temperature of the magnetic memory element increases. However, if the temperature is lower than the magnetic compensation point, as shown by arrows 102 and 102A in FIGS. 3A and 3B, the same set operation as that of the normal case is performed, because the magnetization arrangement of the second magnetic layer 53 is not changed. Therefore, the positive current pulse is a write pulse that is used to make the temperature of the ferrimagnetic layer not reach the magnetic compensation point of the N-type ferrimagnetic material.

Next, the reset operation, that is, the operation of causing the magnetization arrangements of the pinned layer 3 and the free layer 5 to be anti-parallel to each other will be described using FIG. 1A. Similar to the case of the set operation of FIG. 2, the positive current (pulse) is applied from the side of the free layer 5 to perform the operation of the single polarity. At this time, if the current value (or the voltage value) of the current pulse is increased to become larger than the current value at the time of the set operation, the temperature of the magnetic memory element 8 becomes higher than the temperature at the time of the set operation due to the Joule heating based on the current, and the arrival temperature can exceed the magnetic compensation point $T_{comp}$. (1) of FIG. 1A shows a state before the temperature rises and (2) of FIG. 1A shows a state after the temperature rises. If the temperature rises and exceeds the magnetic compensation point $T_{comp}$, the magnetization direction of the first magnetic layer 51 is parallel to the magnetization direction of the pinned layer 3. However, the magnetization direction of the second magnetic layer 53 is reversed from the magnetization direction until the temperature exceeds the magnetic compensation point $T_{comp}$, as shown by an arrow 102B of FIG. 1A. This is a property of the N-type ferrimagnetic material.

Since the current continuously flows, the second magnetic layer 53 of the magnetic memory element is maintained at the temperature of the magnetic compensation point or more, and the current-injection magnetization reversal is performed even in the second magnetic layer 53 through the first magnetic layer 51. Therefore, as shown by an arrow 102C of (3) of FIG. 1A, the magnetization direction of the second magnetic layer 53 becomes parallel to the magnetization direction of the first magnetic layer 51 and the pinned layer 3. This magnetization arrangement contributes to stable switching, even though the exchange coupling force between the first magnetic layer 51 and the second magnetic layer 53 acts such that the magnetization directions of the first magnetic layer 51 and the second magnetic layer 53 are parallel to each other, in addition to the current-injection magnetization reversal. If the current pulse is cut, due to the stop of the current injection, the operation of the current-injection magnetization reversal is first completed. Then, the temperature of the free layer 5 is lowered to the magnetic compensation point or less, and the temperature of the magnetic memory element 8 (temperature of the free layer 5) becomes the magnetic compensation point or less. As a result, as shown in (4) of FIG. 1A, the magnetization direction of the second magnetic layer 53 is reversed.

Even at this point of time, the exchange coupling force acts on the magnetization of the first magnetic layer 51 and the magnetization of the second magnetic layer 53, and the magnetic directions become the same direction. At this time, the magnetization directions of the first magnetic layer 51 and the second magnetic layer 53 may be parallel or anti-parallel to the magnetization direction of the pinned layer 3. In this case, if the reset operation is completed, this means that the magnetization direction of the first magnetic layer 51 becomes equal to the magnetization direction of the second magnetic layer 53. For this reason, the structure of the free layer 5 is taken such that the product of the magnetization and the thickness of the first magnetic layer 51 becomes smaller than the product of the magnetization and the thickness of the second magnetic layer 53, the magnetization of the first magnetic layer 51 is configured to be reversed easier than the magnetization of the second magnetic layer 53, and the reset operation can be completed. In this way, as shown in (5) of FIG. 1A, if the magnetization direction of the first magnetic layer 51 becomes parallel to the magnetization direction of the second magnetic layer 53, the magnetization of the free layer is reversed to the magnetization before the current pulse is applied, and the reset operation is completed. That is, the reset operation based on the current-injection magnetization reversal using the electric pulse having the single polarity is enabled.

Figure 4:
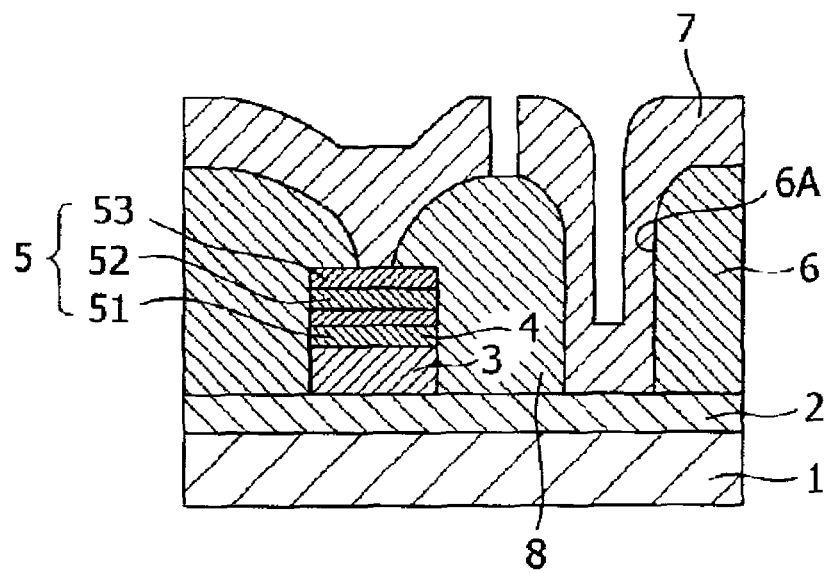
FIG. 4 is a cross-sectional view of a magnetic memory element according to an embodiment of the present invention.

Hereinafter, the specific element structure and a method of manufacturing the element will be described using the drawings. FIG. 4 is a cross-sectional view of the magnetic memory element according to the embodiment of the present invention. A lower electrode 2 (Cu/Ta), a pinned layer 3 (CoFeB/Ru/CoFe/IrMn), a tunnel insulating film 4 (MgO/Mg) functioning as a non-magnetic layer, and a free layer 5 (GdFeCo (reference numeral 53)/Ru (reference numeral 52)/CoFeB (reference numeral 51)) are sequentially formed on a substrate 1. The substrate is processed using a method such as Ar ion milling to have a bonding size of 100×100 nm, and an interlayer insulating film 6 (SiO$_2$) is formed. Then, an upper electrode 7 (Cu/Ta) is formed through a contact hole 6A with respect to a junction portion and the lower electrode.

In this case, in the individual layers of the free layer 5 that has the three-layer structure, as described above, CoFeB is selected as the first magnetic layer 5, Ru is selected as the intermediate layer 52, and GdFeCo is selected as the second magnetic layer 53. The reason why CoFeB is selected as the first magnetic layer 51 is as follows. As already known, in CoFeB/MgO/CoFeB of the junction portion, when the element is manufactured, only MgO is a crystallized film and CoFeB is amorphous. By annealing treatment to be described below, a magnetoresistance ratio of the structure becomes 100% or more and the structure can be used in the non-volatile memory. As in the above configuration example, since a magnetic characteristic is prevented from being deteriorated due to oxidization of the magnetic layer at the interface with MgO (spin polarization ratio is directly effective in a magnetoresistance ratio), an Mg metal may be formed to be thin (not more than 1 to 2 nm), on a surface contacting the MgO layer. This is preferable because rare earths are easily oxidized when an amorphous alloy made of rare-earth transition metals such as GdFeCo, GdCo or TbFeCo is used.

In this embodiment, Ru is selected as the intermediate layer 52. Since the spin relaxation length of Ru is about 2 m or less, the thickness of the intermediate layer 52 may be selected such that the exchange coupling between the first magnetic layer 51 and the second magnetic layer 53 to be described below becomes ferromagnetic. This exchange coupling is based on RKKY interaction, a coupling property becomes ferromagnetic or antiferromagnetic according to the distance between the magnetic materials and periodical vibration is generated, and a vibration period thereof becomes $1/(2\,k_F)$ ($K_F$ is Fermi wave number). In this embodiment, the thickness of the intermediate layer 52 is about 1 nm. Further, condition setting of the thickness of Ru can be performed by manufacturing only the three-layer structure, measuring magnetic hysteresis, and confirming acquisition of ferromagnetic hysteresis.

Finally, a GdFeCo alloy is selected as the second magnetic layer 53. This reason is that the magnetic compensation point of the second magnetic layer 53 can be set in the above-described device operation temperature range, and an easy magnetization axis can be maintained in a plane or can include a perpendicular component (that is, out of the plane) by adjusting the composition of the GdFeCo alloy. The annealing treatment that crystallizes CoFeB after the element is formed is performed at the temperature of about 200° C. to 350° C. However, at this time, crystallization of CoFeB is accelerated from the MgO interface corresponding to the crystal film. Since Ru is used as the intermediate film 52, when GdFeCo is adopted as the second magnetic layer 53, this is advantageous in the process in that an annealing time can be easily selected to cause GdFeCo not directly forming the interface even though crystallization of CoFeB is completed to be non-crystallized. The production of the magnetization and the thickness of the first magnetic layer 51 is configured to be smaller than the product of the magnetization and the thickness of the second magnetic layer 53. For example, when CoFeb is used in the first magnetic layer 51 and GdFeCo is used in the second magnetic layer 53, it is preferable to set the thickness of the first magnetic layer 51 to be about 2 nm or less and set the thickness of the second magnetic layer 53 to be about 6 nm or more. This is because the component of the alloy is adjusted and the magnetization of CoFeB is configured to become about the triple of the magnetization of GdFeCo. In the free layer 5 that has the three-layer structure, CoFeB that is formed on the MgO interface and shows a high magnetoresistance ratio can be adopted, and the N-type ferrimagnetic material that functions as the second magnetic layer 53 can be selected independently from an index such as the temperature dependency of the magnetic characteristic or the easy magnetization axis.

As such, if the combination is selected such that the easy magnetization axis of GdFeCo is out of the plane, the easy magnetization axis includes the perpendicular magnetization component, and it is not needed to apply shape anisotropy for stable switching of the free layer. Therefore, the element area can be isotropic (specifically, circular or square). That is, this is advantageous in terms of improvement of a degree of integration or reduction of a threshold value current of switching.

As described above, the magnetization reversal of the free layer based on the electric pulse of the single polarity is enabled by the magnetic memory element according to the embodiment, and switching of both the set operation and the reset operation is enabled. The materials, the combination, and the formation method that are exemplified in this embodiment are not limitative.

[Second Embodiment]

Figure 5:
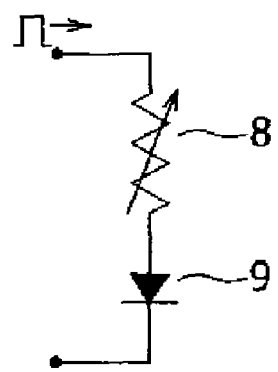
FIG. 5 is a diagram schematically showing a magnetic memory element and a rectifier element that constitute a cross point type memory cell array corresponding to a non-volatile storage device according to an embodiment of the present invention.

Next, as another embodiment of the present invention, an example of the configuration of a non-volatile storage device that uses the magnetic memory element will be described using FIGS. 5 and 6.

Figure 6:
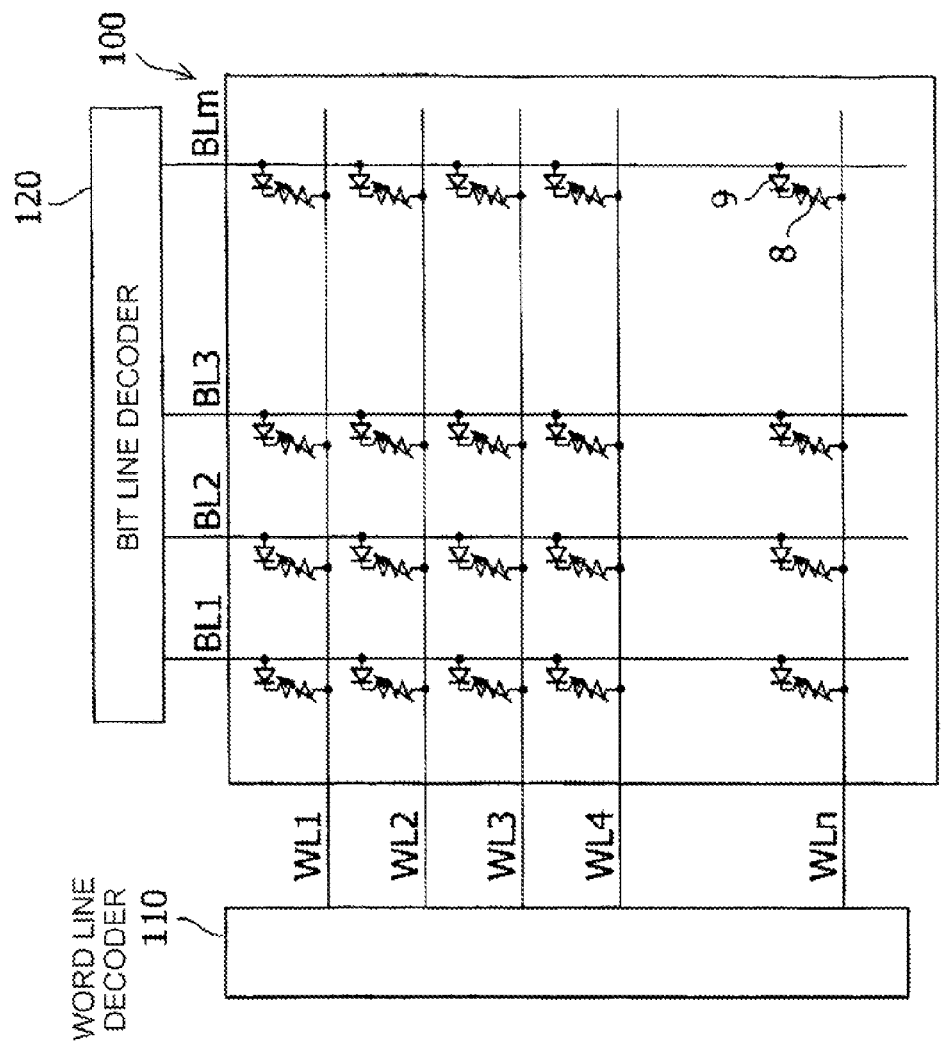
FIG. 6 is a block diagram of the circuit configuration of a cross point type memory cell array corresponding to a non-volatile storage device according to an embodiment of the present invention.

FIG. 6 schematically shows a magnetic memory element and a rectifier element that constitute a cross point type memory cell array corresponding to the non-volatile storage device according to the embodiment of the present invention. As described above, switching based on the electric pulse of the single polarity is enabled by the magnetic memory element and the driving method thereof according to the embodiment of the present invention. Therefore, the cross point type memory is formed by serially connecting the rectifier element (in this case, for example, diode 9) functioning as a selection switch of the magnetic memory element 8 and forming an upper electrode and a lower electrode in an array shape. For example, the diode can be previously formed on the Si substrate and the magnetic memory element according to the embodiment of the present invention can be formed thereon. By applying the electric pulse of the positive polarity from the side of the free layer, switching can be efficiently performed.

A maximum value of the process temperature that is needed to manufacture the magnetic memory element according to the embodiment of the present invention is about 350° C. needed to perform the annealing treatment, and the process temperature does not deteriorate performance of an transistor for electric pulse supply or a diode for a cell selection switch to be formed in a lower portion. Since a wiring line can have resistance against the temperature of the annealing treatment, the combination of the memory cells having the 1 diode-1 MTJ configuration can be three-dimensionally stacked and the memory capacity can be increased.

FIG. 7 is a block diagram showing a structure of a memory array of a non-volatile storage device 100 where the memory cells using the magnetic memory element and the rectifier element of FIG. 6 are driven by a word line and a bit line. When memory contents are written, an accessed word line is selected from the word lines WLi (i=1 to n), by a word line decoder 110. With respect to a row of the memory cells that are connected to the selected word line, a signal corresponding to written data is applied from a bit line decoder 120 to the corresponding memory cells through the bit lines BLj (j=1 to m). For example, the voltage of the word line that is not accessed is maintained at the high voltage, the current does not flow into the magnetic memory element 8 by the action of the diode 9, and only the accessed word line is connected to GND. If the voltage difference with the bit line is taken, a signal that realizes the set operation or the reset operation according to the needed data is applied from the bit line decoder 120 to each of the memory cells connected to the accessed word line. The difference of the signals of the set operation and the reset operation may be set to the arbitrary difference to control the arrival temperature of the MTJ portion of the magnetic memory element. However, as described above, the signals are preferably the pulses of the single polarity where the pulse widths are different.

When the memory contents are read, a current detector (not shown in the drawings) that is provided in the bit line decoder 120 to correspond to each bit line detects the current which each bit line flows with respect to the word line selected by the word line decoder operated in the same way as the case of the write operation, the current value according to the resistance of the magnetic memory element 8 corresponding to each bit line is detected in the accessed word line, and the state of the magnetic memory element 8 is read.

The embodiments of the present invention are described. However, the present invention is not limited to the above-described embodiments and various changes, modifications, and combinations can be made on the basis of the technical sprit of the present invention.

The invention claimed is:

1. A magnetic memory element that has a spin valve structure including a free layer, a non-magnetic layer, and a pinned layer, the non-magnetic layer being interposed between the pinned layer and the free layer,
wherein write pulses to control a combination of a magnetization of the free layer and a magnetization of the pinned layer are applied between the free layer and the pinned layer of the spin valve structure, and thus information according to the write pulses is recorded,
the free layer has a three-layer structure in which a first magnetic layer, an intermediate layer, and a second magnetic layer are stacked starting from a side of the non-magnetic layer,
the first magnetic layer is made of a ferromagnetic material,
the intermediate layer is made of a non-magnetic material,
the second magnetic layer includes an N-type ferrimagnetic material that has a magnetic compensation point $T_{comp}$ within a temperature range where a memory storage operation of the magnetic memory element can be available, and
magnetization directions of the first magnetic layer and the second magnetic layer are parallel to each other at a temperature lower than the magnetic compensation point $T_{comp}$.

2. The magnetic memory element of claim 1, wherein the intermediate layer includes Ru or Cu.

3. The magnetic memory element of claim 1, wherein a thickness of the intermediate layer is 2 nm or less.

4. The magnetic memory element of claim 1, wherein an easy magnetization axis of the first magnetic layer is any direction in a plane of the first magnetic layer and an easy magnetization axis of the second magnetic layer is a direction that has a component vertical with respect to the plane of the first magnetic layer.

5. The magnetic memory element of claim 3, wherein the non-magnetic layer is made of magnesium oxide,
the first magnetic layer is made of a CoFeB alloy or a CoFe alloy, and
the second magnetic layer is made of a two-dimensional or three-dimensional rare earth transition metal alloy including a combination of at least one rare earth metal selected from a group consisting of Tb and Gd and at least one transition metal selected from a group consisting of Fe and Co.

6. The magnetic memory element of claim 1, wherein the magnetic compensation point $T_{comp}$ of the N-type ferrimagnetic material is lower than a temperature of the second magnetic layer that is obtained when one write pulse is applied, and is higher than a temperature of the second magnetic layer that is obtained when another write pulse is applied.

7. A non-volatile storage device, comprising:
the magnetic memory element according to claim 1;
a rectifier element that is connected in series to the magnetic memory element;
a first write pulse that causes a combination state of the magnetization of the free layer and the magnetization of the pinned layer in the spin valve structure of the magnetic memory element to become a first combination state;
an information rewriting unit that generates a second write pulse having a same polarity as a polarity of the first write pulse to cause the combination state to become a second combination state, applies the second write pulse to the rectifier element and the magnetic memory element, and executes a write/erase operation; and
a read unit that reads the information from an amount of current flowing through the magnetic memory element.

8. A non-volatile storage device, comprising:
the magnetic memory element according to claim 2;
a rectifier element that is connected in series to the magnetic memory element;
a first write pulse that causes a combination state of the magnetization of the free layer and the magnetization of the pinned layer in the spin valve structure of the magnetic memory element to become a first combination state;
an information rewriting unit that generates a second write pulse having a same polarity as a polarity of the first write pulse to cause the combination state to become a second combination state, applies the second write pulse to the rectifier element and the magnetic memory element, and executes a write/erase operation; and
a read unit that reads the information from an amount of current flowing through the magnetic memory element.

9. A non-volatile storage device, comprising:
the magnetic memory element according to claim 3;
a rectifier element that is connected in series to the magnetic memory element;
a first write pulse that causes a combination state of the magnetization of the free layer and the magnetization of the pinned layer in the spin valve structure of the magnetic memory element to become a first combination state;
an information rewriting unit that generates a second write pulse having a same polarity as a polarity of the first write pulse to cause the combination state to become a second combination state, applies the second write pulse to the rectifier element and the magnetic memory element, and executes a write/erase operation; and
a read unit that reads the information from an amount of current flowing through the magnetic memory element.

10. A non-volatile storage device, comprising:
the magnetic memory element according to claim 4;
a rectifier element that is connected in series to the magnetic memory element;
a first write pulse that causes a combination state of the magnetization of the free layer and the magnetization of the pinned layer in the spin valve structure of the magnetic memory element to become a first combination state;
an information rewriting unit that generates a second write pulse having a same polarity as a polarity of the first write pulse to cause the combination state to become a second combination state, applies the second write pulse to the rectifier element and the magnetic memory element, and executes a write/erase operation; and
a read unit that reads the information from an amount of current flowing through the magnetic memory element.

11. A non-volatile storage device, comprising:
the magnetic memory element according to claim 5;
a rectifier element that is connected in series to the magnetic memory element;
a first write pulse that causes a combination state of the magnetization of the free layer and the magnetization of the pinned layer in the spin valve structure of the magnetic memory element to become a first combination state;

an information rewriting unit that generates a second write pulse having a same polarity as a polarity of the first write pulse to cause the combination state to become a second combination state, applies the second write pulse to the rectifier element and the magnetic memory element, and executes a write/erase operation; and a read unit that reads the information from an amount of current flowing through the magnetic memory element.

12. A non-volatile storage device, comprising:

the magnetic memory element according to claim 6;

a rectifier element that is connected in series to the magnetic memory element;

a first write pulse that causes a combination state of the magnetization of the free layer and the magnetization of the pinned layer in the spin valve structure of the magnetic memory element to become a first combination state;

an information rewriting unit that generates a second write pulse having a same polarity as a polarity of the first write pulse to cause the combination state to become a second combination state, applies the second write pulse to the rectifier element and the magnetic memory element, and executes a write/erase operation; and a read unit that reads the information from an amount of current flowing through the magnetic memory element.

13. A magnetic memory element, comprising:

a free layer including a first magnetic layer, an intermediate layer, and a second magnetic layer;

a pinned layer; and a non-magnetic layer between the free layer and the pinned layer;

wherein the second magnetic layer has a magnetic compensation point within a temperature range suitable for a memory storage operation; and a magnetization direction of the first magnetic layer is parallel to a magnetization direction of the second magnetic layer at a temperature lower than the magnetic compensation point.

14. The magnetic memory element of claim 13, wherein the magnetic memory element is configured to record information by application of write pulses to control a magnetization of the free layer and a magnetization of the pinned layer.

15. The magnetic memory element of claim 13, wherein the first magnetic layer includes a ferromagnetic material.

16. The magnetic memory element of claim 13, wherein the intermediate layer includes a non-magnetic material.

17. The magnetic memory element of claim 13, wherein the second magnetic layer includes an N-type ferrimagnetic material.

18. The magnetic memory element of claim 13, wherein the intermediate layer includes Ru or Cu.

19. The magnetic memory element of claim 13, wherein a thickness of the intermediate layer is 2 nm or less.

20. A non-volatile storage device comprising a magnetic memory element according to claim 13.

* * * * *